(12) United States Patent
Misawa et al.

(10) Patent No.: US 7,542,186 B2
(45) Date of Patent: Jun. 2, 2009

(54) 3-D HOLOGRAPHIC RECORDING METHOD AND 3-D HOLOGRAPHIC RECORDING SYSTEM

(75) Inventors: Hiroaki Misawa, Tokushima (JP); Saulius Juodkazis, Tokushima (JP); Shigeki Matsuo, Tokushima (JP); Toshiaki Kondo, Tokushima (JP)

(73) Assignee: Japan Science and Technology Agency, Saitama (JP)

( * ) Notice: Subject to any disclaimer, the term of this patent is extended or adjusted under 35 U.S.C. 154(b) by 766 days.

(21) Appl. No.: 11/106,520

(22) Filed: Apr. 15, 2005

(65) Prior Publication Data
US 2005/0232116 A1    Oct. 20, 2005

Related U.S. Application Data

(63) Continuation-in-part of application No. 10/529,881, filed as application No. PCT/JP03/12344 on Sep. 26, 2003, now abandoned.

(30) Foreign Application Priority Data
Oct. 3, 2002    (JP) ............................... 2002-291648

(51) Int. Cl.
G03H 1/02 (2006.01)
G03H 1/26 (2006.01)
G03H 1/04 (2006.01)

(52) U.S. Cl. .................................. 359/3; 359/22; 430/1
(58) Field of Classification Search ...................... 359/3, 359/4, 7, 22; 430/1, 2; 369/103
See application file for complete search history.

(56) References Cited

FOREIGN PATENT DOCUMENTS
JP    11-71139    3/1999

OTHER PUBLICATIONS

Toshiaki Kondo et al., "Femtosecond laser interference technique with diffractive beam splitter for fabrication of three-dimensional photonic crystals", Applied Physics Letters, Aug. 6, 2001, vol. 79, No. 6, pp. 725-727.

(Continued)

Primary Examiner—Alessandro Amari
(74) Attorney, Agent, or Firm—Wenderoth, Lind & Ponack, L.L.P.

(57) ABSTRACT

A method of 3D holographic recording by using a very simple optical system includes dividing a femto-second laser pulse into a plurality of light beams by a diffraction beam splitter, focusing four light beams selected from the divided plurality of light beams, controlling each optical phase of the selected four light beams by a phase retarder, and further focusing these four light beams into a sample comprised of a photosensitive material capable of multi-photon exposure so that the photosensitive material is exposed to the interference among the four light beams and multi-photon absorption in the sample is induced, thus recording a 3D phase hologram on the irradiated portion of the sample.

9 Claims, 7 Drawing Sheets

OTHER PUBLICATIONS

Matsuo, "Technique for Producing Photonic Crystals", Optical and Electro-optical Engineering contact, Aug. 20, 2002, vol. 40, No. 8, pp. 480-489 with English translation.

Toshiaki Kondo et al., "Multiphoton fabrication of periodic structures by multibeam interference of femtosecond pulses", Applied Physics Letters, Apr. 28, 2003, vol. 82, No. 17, pp. 2758-2760.

Shigeki Matsuo et al., "Fabrication of Three-Dimensional Photonic Crystals by Femtosecond Laser Interference", Proceedings of SPIE, vol. 4655, 2002, pp. 327-334.

Saulius Juodkazis, "Optical Properties of Femtosecond Irradiated Photo-Thermo-Refractive Glass", Lithuanian Journal of Physics, vol. 42, No. 2, 119-126 (2002), pp. 1-8.

S. Juodkazis et al., "Three-dimensional recording by femtosecond pulses in dielectrics", Proceedings of SPIE Reprint, vol. 4977, Jan. 27-30, 2003, pp. 94-107.

3-D HOLOGRAPHIC RECORDING METHOD AND 3-D HOLOGRAPHIC RECORDING SYSTEM

CROSS-REFERENCE TO RELATED APPLICATION

This application is a Continuation-In-Part of U.S. application Ser. No. 10/529,881 Sep. 12, 2005 now abandoned, which is the National Stage of International application No. PCT/JP2003/012344, filed Sep. 26, 2003.

TECHNICAL FIELD

The invention of this application relates to a method of 3-D holographic recording on photosensitive materials capable of multi-photon exposure including glass that undergoes a photo/thermo-induced refractive index change by means of femto-second laser pulses. More specifically, the invention relates to a 3-D holographic recording method of recording a Bragg diffraction lattice on a photosensitive material capable of multi-photon exposure by using a very simple optical system and femto-second laser pulses.

BACKGROUND ART

The development of photonics is expected to lead to the improvement of technology in the future. In particular, photonic crystals (PhC) are intensely attracting interest, since they have promising applications. However, the fabrication of photonic crystals that function in the Visible or near infrared range is a problem still in need of a solution, despite attempts using the latest developments in micro/nano technology.

At present, as a substitute technique of photonic crystal fabrication, laser interference is attracting attention, since laser interference can easily form one-dimensional (1D)/two-dimensional (2D)/three-dimensional (3D) structures with high practical reliability. For example, the diffraction lattice of a one-dimensional (1D) periodic pattern can be formed by interference of two beams, and the diffraction lattice of a two-dimensional (2D) periodic pattern can be formed by interference of three beams as shown in "Formation of a microfiber bundle by interference of three non-coplanar beams" (literature 1).

With respect to a three-dimensional (3D) periodic pattern, recording can be done generally by using four non-coplanar beams ("All fourteen Bravais lattices can be formed by interference of four non-coplanar beams" (literature 2)). In that case, it is thought to be possible to generate intensity distributions of light corresponding to all Bravais lattices by controlling the directions of four interference beams and the polarization of four beams. However, it is very difficult in practice to experimentally realize such a system.

A means which simplifies this complicated system by making possible free selection of the photonic crystal lattice uses an axially symmetric multi-beam interference system, and with respect to many complicated 1D/2D/3D structures, simplification can be realized by controlling the number, phase and intersection angle of beams. One of the advantages of 1D/2D/3D structures formed when the above laser interference is used is that it is possible to express inherently the temporarily and spatially overlapping parts of all interfering beams.

Although it is very difficult to achieve a 3D structure by using particularly extremely short, sub-pico-second pulses, they are thought necessary in order to accelerate non-linear (multi-step, multi-photon or tunneling) absorption to perform 3D recording into a transparent medium. If a periodic pattern of such light intensity can be recorded inside a material, it becomes easy to fabricate photonic crystals of good quality and the templates thereof.

In recent years, some methods were reported to achieve 3D recording in glass, but femto-second pulses were used in these methods. However, these recording methods have been attained by a relatively slow process, such as shot-by-shot scanning. In addition, conventional methods of recording 3D structure by using femto-second pulses necessitate a very complicated optical system of binding three or more light beams of pulses together at one point for interference exposure, since the pulse width of femto-second pulse is short, so that these methods are not practicable.

Literature 1: L. Z. Cai et al., Optics Letters, Vol. 26, No. 23, pp. 1858-1860 (2001)

Literature 2: L. Z. Cai et al., Optics Letters, Vol. 27, No. 11, pp. 900-902 (2002)

The invention of this application has been made in consideration of these circumstances, and aims at solving the prior art problems and providing a 3D holographic recording method of capable of easily forming a 3D periodic pattern in a photosensitive material capable of multi-photon exposure by using a very simple optical system, and also providing a 3D holographic recording system.

SUMMARY OF THE INVENTION

For solving the above problems, a first aspect of the present invention provides a method of 3D holographic recording which comprises dividing a femto-second laser pulse into a plurality of light beams, focusing the divided plurality of light beams in the parallel direction and selecting four light beams, controlling each optical phase of the selected four light beams, and further focusing these four light beams into a photosensitive material capable of multi-photon exposure so that the photosensitive material is exposed to the interference among the four light beams and multi-photon absorption in the photosensitive material is induced, and recording a 3D phase hologram on the irradiated portion in the photosensitive material.

A second aspect of the present invention is the method of 3D holographic recording as described in the first aspect of the invention, wherein the phase hologram recorded on the irradiated portion in the photosensitive material is a Bragg diffraction lattice.

A third aspect of the present invention is the method of 3D holographic recording as described in the second aspect of the invention, wherein the formed Bragg diffraction lattice is used as a photonic crystal.

A fourth aspect of the present invention is the method of 3D holographic recording as described in any one of the first to third aspects of the invention, wherein the photosensitive material capable of multi-photon exposure is glass that undergoes photo/thermo-induced refractive index change.

A fifth aspect of the present invention is the method of 3D holographic recording as described in the fourth aspect of the invention, wherein the glass that undergoes photo/thermo-induced refractive index change is glass having an approximate composition to $15Na_2O\text{-}5ZnO\text{-}4Al_2O_3\text{-}70SiO_2\text{-}5NaF\text{-}0.01Ag_2O\text{-}0.01CeO_2$.

A sixth aspect of the present invention is a 3D holographic recording system for performing the holographic recording method as described in any one of the first to fifth aspects of the invention, which comprises 1) a laser light source for generating femto-second laser pulses, 2) a diffraction beam splitter for dividing a femto-second laser pulse into a plurality of light beams, 3) two lenses for focusing the divided femto-second laser pulses, 4) an aperture for selecting four light beams out of the divided femto-second laser pulses, and 5) a phase retarder for controlling each optical phase of the selected four light beams.

A seventh aspect of the present invention is the 3D holographic recording system as described in the sixth aspect of the invention, wherein of the two lenses, the lens for focusing the plurality of light beams divided by the diffraction beam splitter into parallel directions is achromatic, and the other lens for focusing the four light beams selected by the aperture on a photosensitive material for interference exposure is an objective lens of a microscope.

Figure 1:
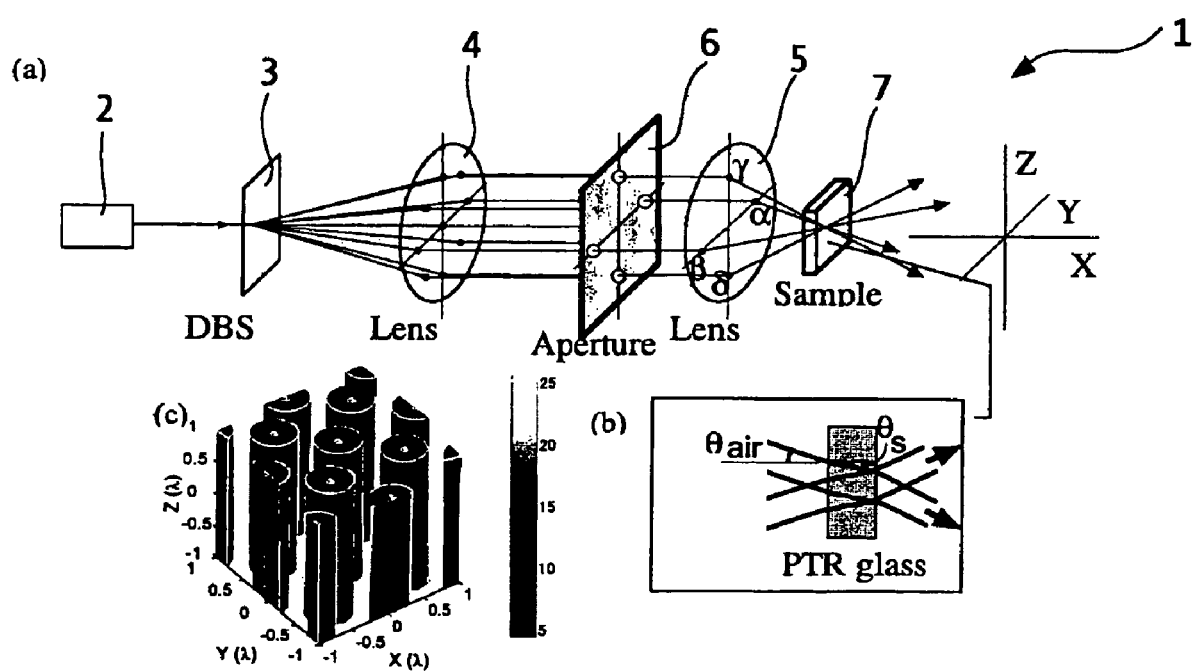
FIG. 1 (a) is a conceptual view of the 3D holographic recording system in the invention, (b) is a conceptual view showing the state of application of four beams to the sample in Fig. (a), and, (c) is a pattern which is to be recorded on a resist with the system shown in Fig. (a).

Reference numerals in the figure are as follows.

1, 1': 3D holographic recording system, 2: Laser light source, 3: Diffraction beam splitter, 4: Achromatic lens, 5: Objective lens, 6: Aperture, 7, 7': Sample. 8: Phase retarder, 9: Beam splitter, 10: lens, 11: CCD.

DETAILED DESCRIPTION OF THE INVENTION

A 3D holographic recording method in the invention of this application comprises dividing a femto-second laser pulse into a plurality of light beams by a diffraction beam splitter, focusing the divided plurality of light beams in the parallel direction, selecting four light beams, focusing these four light beams, and exposing a photosensitive material capable of multi-photon exposure to these four light beams so that the photosensitive material is exposed to the interference among the four light beams and multi-photon absorption in the photosensitive material is induced, thus forming a 3D phase hologram, in particular a Bragg diffraction lattice, on the irradiated portion in the photosensitive material.

Also, a method of 3D holographic recording in the invention of this application comprises dividing a femto-second laser pulse into a plurality of light beams, focusing the divided plurality of light beams in the parallel direction, selecting four light beams, controlling each optical phase of the selected four light beams, and further focusing these four light beams into a photosensitive material capable of multi-photon exposure so that the photosensitive material is exposed to the interference among the four light beams and multi-photon absorption in the photosensitive material is induced, thus recording a 3D phase hologram on the irradiated portion in the photosensitive material.

According to this method, a Bragg diffraction lattice of high quality can be recorded in photographic materials capable of multi-photon exposure including glass that undergo photo/thermo-induced refractive index change by using a very simple optical system and, as a result, it becomes possible to easily manufacture photonic crystals of high quality. Further, "glass that undergoes photo/thermo-induced refractive index change" in the invention of this application means "glass undergoing photo/thermo-induced refractive index change by heat treatment after the application of ultra-violet rays". In addition, the control of each optical phase of the selected light beams enables a further fine structure to be formed.

In particular, in the 3D holographic recording method in the invention of this application, as the glass that undergoes photo/thermo-induced refractive index change, PTR glass (photo-thermo-refractive glass) having an approximate composition of $15Na_2O-5ZnO-4Al_2O_3-70SiO_2-5NaF-0.01Ag_2O-0.01CeO_2$ can be preferably used, and by using such PTR glass, particularly high quality Bragg diffraction lattices can be recorded.

As the system for performing the 3D holographic recording method in the invention of this application, a 3D holographic recording system comprises a laser light source for generating femto-second laser pulses, a diffraction beam splitter for dividing a femto-second laser pulse into a plurality of light beams, two lenses for focusing the plurality of divided femto-second laser pulses, and an aperture between those two lenses for selecting four light beams from among the divided femto-second laser pulses can be used.

Further, as the system for performing the 3D holographic recording system in the invention of this application, a 3D holographic recording system comprises a laser light source for generating femto-second laser pulses, a diffraction beam splitter for dividing a femto-second laser pulse into a plurality of light beams, two lenses for focusing the divided femto-second laser pulses, an aperture for selecting four light beams from among the divided femto-second laser pulses, and a phase retarder for controlling each optical phase of the selected four light beams.

In addition, of the two lenses, as the lens for focusing the femto-second laser pulse divided by the diffraction beam splitter in the parallel direction, an achromatic lens can be preferably used, and as the lens for focusing the four light beams on a photosensitive material and interference exposure, an objective lens of a microscope can be preferably used. By using the 3D holographic recording system equipped with these optical instruments, a Bragg diffraction lattice that is a 3D phase hologram can be formed in a photosensitive material by means of a very simple optical system.

Especially, the control of each optical phase of the selected light beams by the phase retarder enables a further fine structure to be formed.

The mode for carrying out the invention will be described in more detail with reference to the accompanying drawings. The invention is not limited to the following examples, and with respect to details, it is of course possible to adopt various modifications.

EXAMPLE

A Bragg diffraction lattice was recorded on a PTR glass sample that is a photosensitive material capable of multiphoton exposure according to the 3D holographic recording method in the invention of this application.

As shown in FIG. 1 (a), as a 3D holographic recording system (1) for use in the recording of a multi-beam interference pattern, a diffractive beam splitter (DBS) (3) for dividing the laser beam of the femto-second laser pulse generated from a laser light source (2) was installed, an achromatic lens (4) having a focal distance of 175 mm and an objective lens (5) of a microscope were installed on the optical path of the laser beam after passing through the diffractive beam splitter (3), and an aperture (6) for selecting four light beams was provided between the achromatic lens (4) and the objective lens (5).

By using these optical instruments, a femto-second laser pulse beam generated from the laser light source (2) was divided into a plurality of light beams with the diffractive beam splitter (3), those light beams were focused in the parallel direction by means of the achromatic lens (4) arranged to the rear of the diffractive beam splitter (3), four light beams for obtaining a 3D interference pattern were selected by the aperture (6) installed to the rear of the achromatic lens (4), the four laser beams were focused by the objective lens (5) of a microscope, those laser beams were focused on sample (7) consisting of a photosensitive material, and the four light beams interfered with each other in the sample (7). The radial positions of the beam passing portions of the aperture (6) can be determined in consideration with the magnification of the objective lens (5) and the incident angle θ.

Figure 5:
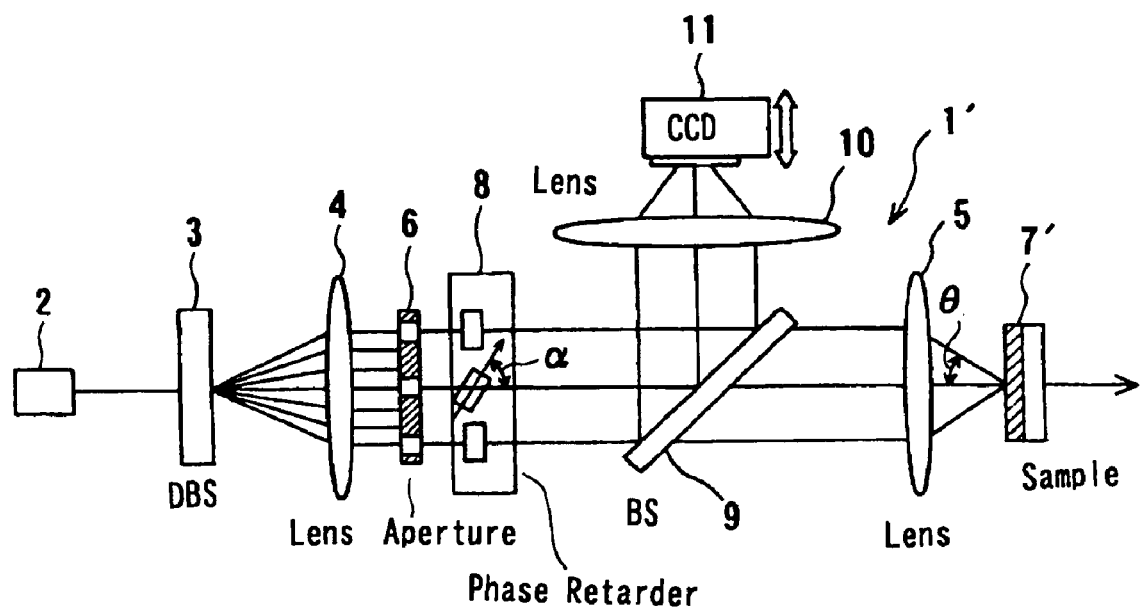
FIG. 5 is a conceptual view of the 3D holographic recording system provided with a phase retarder in the invention.

FIG. 5 is a conceptual view of the 3D holographic recording system (1') provided with a phase retarder in the invention, in which a diffractive beam splitter (DBS) (3) for dividing the laser beam of the femto-second laser pulse generated from the laser light source (2) was installed, an achromatic lens (4) having a focal distance of 175 mm and an objective lens (5) of a microscope were installed on the optical path of the laser beam after passing through the diffractive beam splitter (3), an aperture (6) for selecting four light beams was provided between the achromatic lens (4) and the objective lens (5), a phase retarder (8) for controlling each optical phase of the selected four light beams and a beam splitter (9) for reflecting and sending a part of the selected four light beams through a lens (10) to a CCD (11) and for transmitting the remainder of the selected four light beams were installed between the aperture (6) and the objective lens (5). The CCD (11) was installed for observing the light beam interference patterns.

Figure 6:
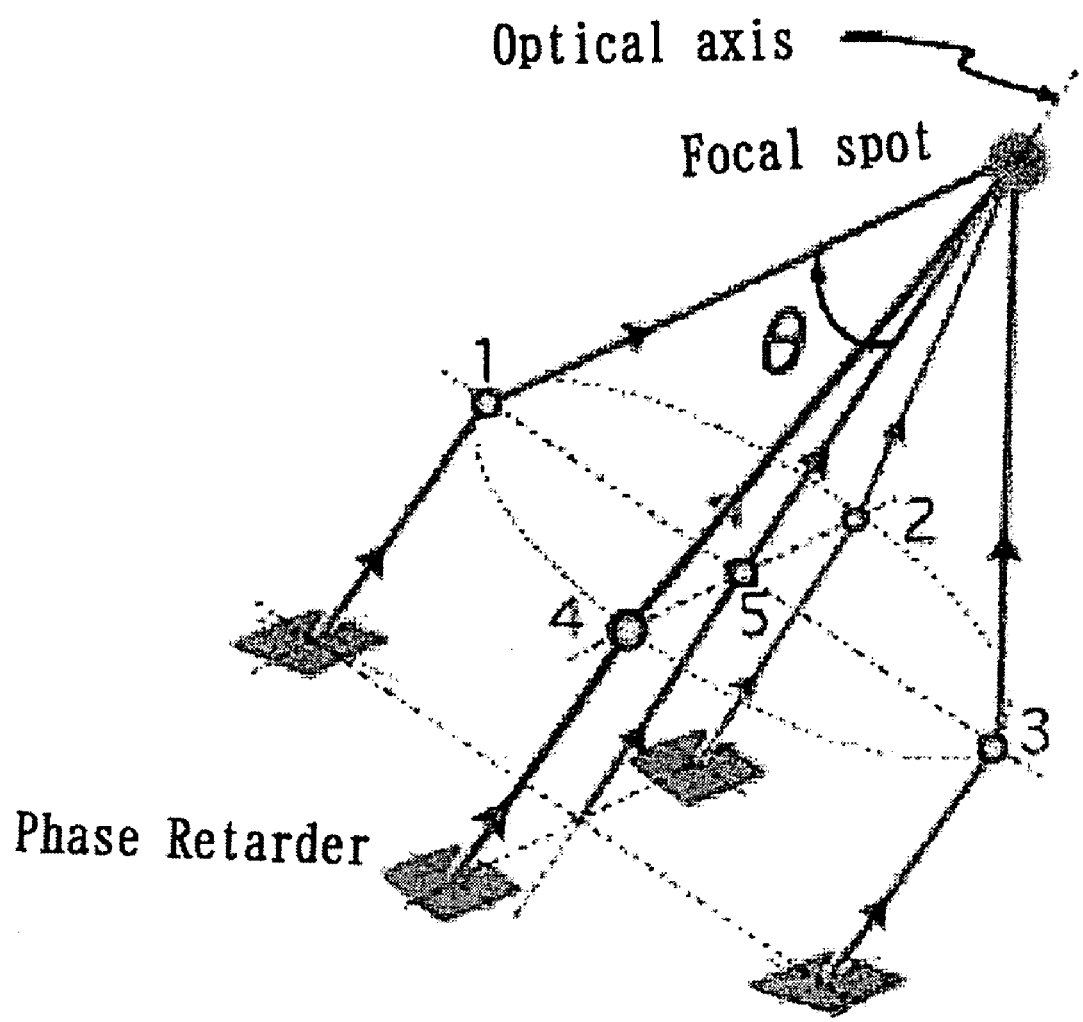
FIG. 6 is a diagram for explaining the phase change of each laser beam by the phase retarder.

The phase retarder (8) includes four transparent plates (8-1), (8-2), (8-3) and (8-4) each made of a dielectric material to control each optical phase of the selected four light beams, respectively. As shown in FIG. 6, when the tilt angle (α) of each of the four transparent dielectric plates (8-1), (8-2), (8-3) and (8-4) changes, the optical path length of each of the four light beams passing through the four transparent dielectric plates (8-1), (8-2), (8-3) and (8-4) also changes in accordance therewith, so that each optical phase of the four light beam changes. Here, the phases of the four light beams are expressed as $\phi_1$, $\phi_2$, $\phi_3$ and $\phi_4$. In this example, $\phi_1$ and $\phi_2$ were 90 degrees ($\pi/2$), respectively, and $\phi_3$ and $\phi_4$ were zero, where the phase control was performed. Of course, the phase control of the invention is not restricted to the case. Various combinations such as $\phi_1=\phi_3=\pi/2$ and $\phi_2=\phi_4=0$; $\phi_1=\phi_2=\phi_3=\pi/2$ and $\phi_4=0$ may be selected. In addition, the different phase shift values such as $\pi/3$, $2\pi$ other than $\pi/2$ may be used. The formed patterns can be changed in accordance with the manner of the phase control.

Figure 7:
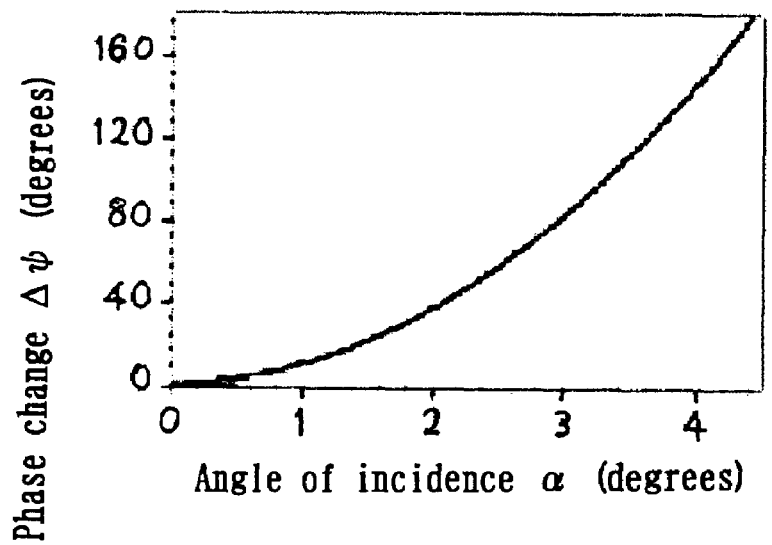
FIG. 7 is a diagram showing the relationship between the tilt angle of the transparent dielectric plate of the phase retarder and the phase change.

FIG. 7 is a diagram of the simulation curve showing the relationship between the tilt angle (α) of the transparent dielectric plate of the phase retarder (8) and the optical phase change (Δφ). It is understood from FIG. 7 that the phase change can be controlled arbitrarily in accordance with the change of the tilt angle (α).

By using the optical instruments as shown in FIG. 5, a femto-second laser pulse beam generated from the laser light source (2) was divided into a plurality of light beams with the diffractive beam splitter (3), those light beams were focused in the parallel direction by means of the achromatic lens (4) arranged to the rear of the diffractive beam splitter (3), four light beams for obtaining a 3D interference pattern were selected by aperture (6) installed to the rear of the achromatic lens (4), the selected four light beams were subjected to the optical phase control by the phase retarder (8), the phase-controlled four laser beams were focused by the objective lens (5) of a microscope, those laser beams were focused on sample (7') consisting of a photosensitive material, and the four light beams interfered with each other in the sample (7').

Since the optical distance between femto-second laser pulse beams of the plurality of light beams divided are equal down to the same degree of precision as the length of the laser pulse, temporarily duplication of the divided laser pulses can be achieved with no artificial adjustment. In addition, since the transparent dielectric plates are disposed per each of the selected light beams, temporarily duplication of the divided laser pulses can be achieved. Further, each laser pulse beam is slightly narrowed for increasing irradiance on the exposure region.

A fourfold (square) symmetry interference pattern was formed in sample (7) by the laser pulse beams of four light beams. The angle $\theta_{air}$ between the central axis and each light beam in FIG. 1 (b) was 33.6°.

In the exposure of the sample in this example, a femto-second laser pulse obtained by a Ti sapphire oscillator (Tsunami & Spitfire, Spectra Physics) with a regenerative amplifier was used. The repetition frequency of this laser pulse was 1 kHz, the pulse width was 150 fs, and the wavelength was 800 nm. The laser power of the femto-second laser pulse on the front side of diffractive beam splitter (DBS) (2) was 210 mW, but it was 1.7 mW at the position of sample (7) in the exposure time of 3 minutes.

In this example, as the three kinds of samples, a negative photo-resist SU-8 membrane (Microlithography Chemical Corp.) for tests, PTR (photo-thermo-refractive) glass that undergoes photo/thermo-induced refractive index change, and sodium silicate glass for reference were used.

A sample SU-8 membrane with absorption at λ<400 nm was coated by spin coating on a cover glass plate in a thickness of about 5 to 6 μm, the sample was pre-baked before exposure, irradiated with a laser pulse beam, post-baked to reinforce a photo-excitation crosslinking reaction, and subsequently the image was developed to thereby remove the non-crosslinked region and obtain a 3D structure. The structure of the resist of the 3D structure was coated with an Au thin film by sputtering, and observed with a scanning electron microscope (SEM: Hitachi S-4200SE).

Figure 2:
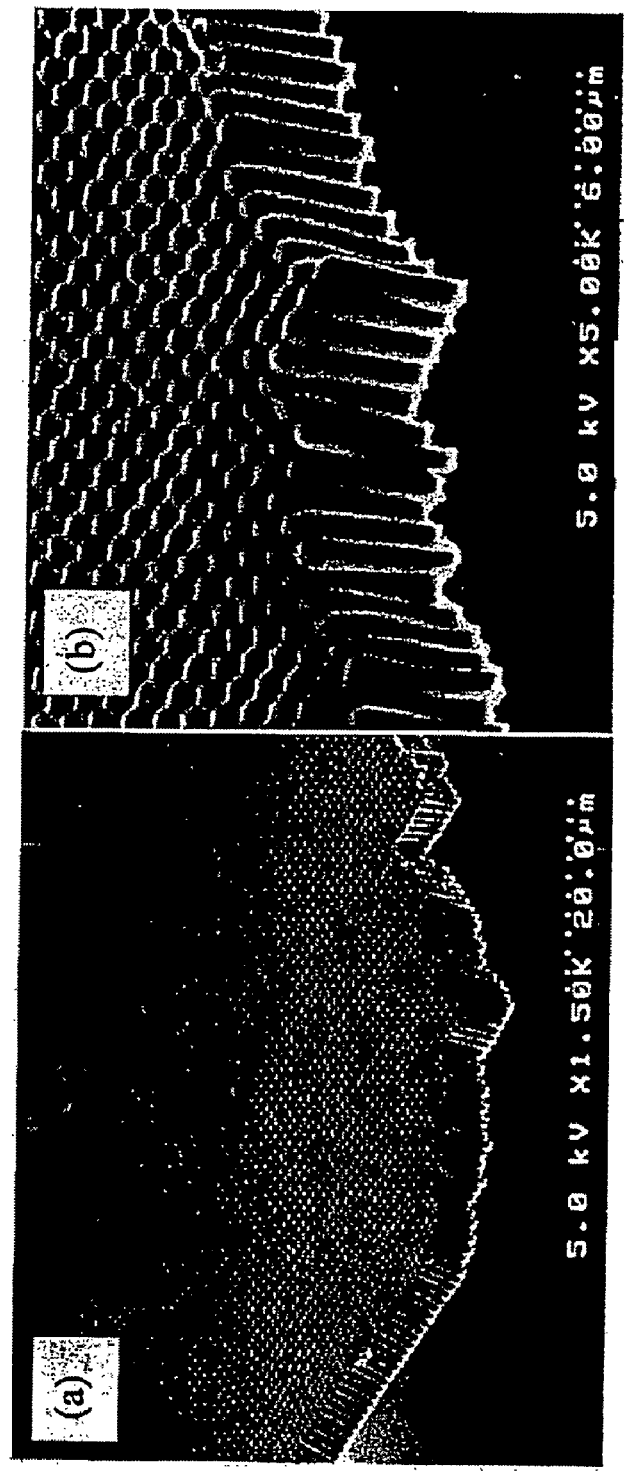
FIG. 2 is a photograph showing the SEM image of the Bragg diffraction lattice recorded in a resist according to the 3D holographic recording method in the invention.

On the above conditions, a 2D photonic crystal having a 3D rod structure was recorded in the resist film by the interference of four beams, and the structure of the photonic crystal estimated at that time was computed from the light intensity pattern formed by the four beams according to the following equation.

$$I(\vec{r}) = \left\langle \left| \sum_{i=1}^{4} E_i \cos(\vec{k}_i \cdot \vec{r} - \omega t + \varphi_i) \right|^2 \right\rangle$$

where $E_i$ is the amplitude of radiation at the visual field, $k_i$ and $\psi_i$ are the wave number vector and the phase of corresponding beam, respectively. while $\omega$ is repetition frequency, r is the coordinate vector, and t is for time. The pattern recorded in the resist by this computation was predicted to be the same as the pattern shown in FIG. 1 (c) (in the above computation, $\psi_i$ was taken as 0, and the electric field amplitude as 1). This judgment was based on the experiment of pre-stage showing that the shape of recorded 3D structure faithfully follows the light intensity distribution given by equation (1) when $\psi_i$=0. The structure recorded and developed in the resist had a structure extremely close to the predicted structure, as shown in the SEM images of FIGS. 2 (a) and (b). The period of the formed structure was 1 µm, and this value is sufficiently close to the estimated value of $\lambda/(\sqrt{2} \sin \theta_{air})$=1.02 µm. As shown in FIG. 2 (b), when the structure is enlarged, ripples are discriminated along the direction of the propagation of light (perpendicular to the image). These ripples are generated by the interference of the light reflected from the rear of the boundary of the air and the resist which has a forward propagation direction. A laser pulse duration for 150 fs has a corresponding coherence length of about 45 µm, and the ripples occurred throughout the thickness of the film having thickness of 5 µm.

After it was ascertained that it is possible to make a hologram of a 3D structure in a resist, a PTR glass sample and a sodium silicate glass sample for reference each having the same shape as the resist were exposed to light.

PTR glass having the approximate composition 15Na$_2$O-5ZnO-4Al$_2$O$_3$-70SiO$_2$-5NaF-0.01Ag$_2$O-0.01CeO$_2$ (in mol %) was used, and the PTR glass and sodium silicate glass 22Na$_2$O$_3$-CaO-75SiO$_2$ were synthesized from high purity materials according to standard experimental methods, and the concentration of absorptive impurities was maintained at about 1 ppm or less. The sodium silicate glass was used as the pure matrix material contrasting with the PTR glass, i.e., for reference. These glass components were melted in a quartz crucible in an electric furnace, the obtained samples were cut to a size of 10×5×2 mm$^3$, and four sides were polished. The time of irradiation with a laser beam was from 5 to 10 minutes.

Figure 3:
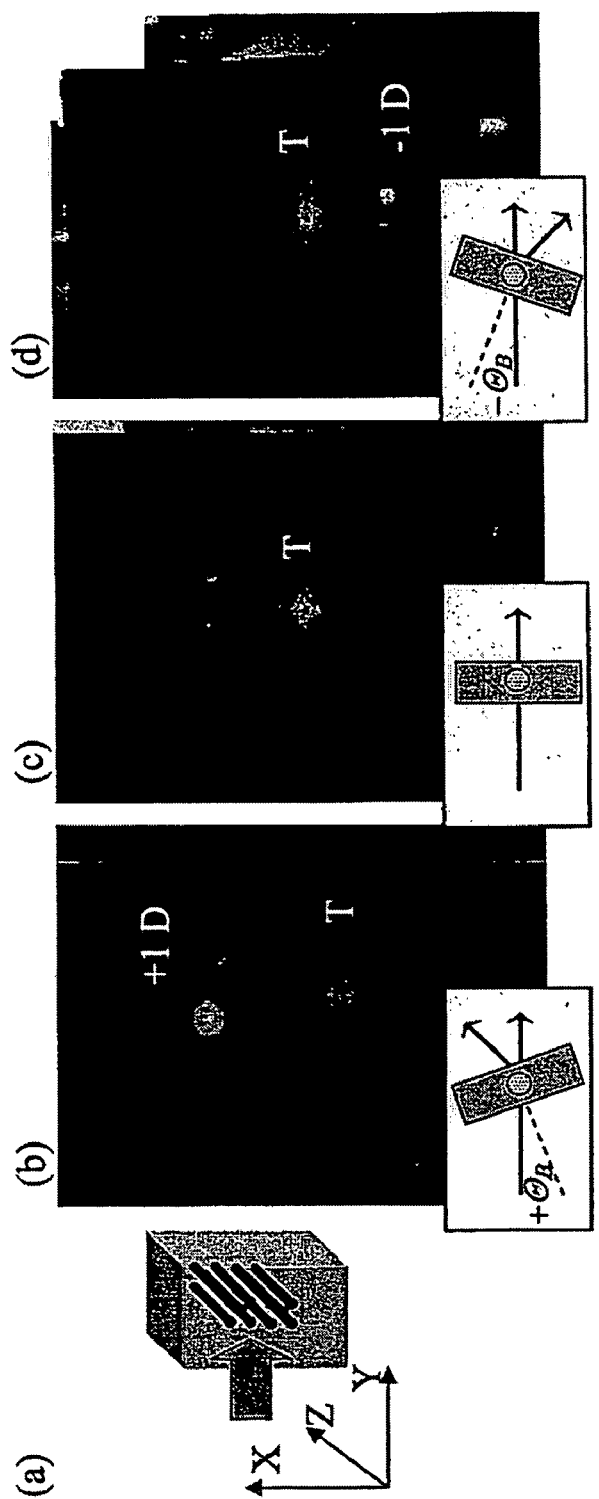
FIG. 3 (a) is a conceptual view showing the reading out experiment of the Bragg diffraction lattice formed according to the 3D holographic recording method in the invention, and (b), (c) and (d) are photographs respectively showing the examples of the results of an experiment reading out the Bragg diffraction lattice formed according to the 3D holographic recording method in the invention.

After exposure and heat treatment of the PTR glass, the sample was cut as shown in FIG. 3 (a) to allow side irradiation which makes read out of the recorded structure easier, and the sample was exposed to the interference among the two light beams along the Z axis to record a hologram while focusing the light in the PTR glass. The hologram was read out by the application of a focused He—Ne laser of 543.5 nm. The heat treatment was performed by increasing the temperature from the room temperature up to 520° C. at the increasing rate of 20° C./sec in the air and maintaining the temperature for 1-2 hours. It is noted in this heat treatment that the temperature should not exceed 600° C. in order to avoid the generation of non-uniform crystallization of metal atoms in the PTR glass. The heat treatment may be performed under inert gas atmosphere such as nitrogen gas or argon gas.

As a result, a clear and accurate Bragg diffraction pattern was observed, as estimated from the diffraction of the thick diffraction lattices as shown in FIGS. 3 (b) to (d). FIG. 3 (b) shows Bragg diffraction from the hologram recorded by four light beams at the incident angle of θ, as is shown in the drawing, (c) is the case where the same hologram is read out by right angle incident light, and (d) is the case where the hologram is read out by light at the incident angle −θ. In these drawings, the penetrating light beam and diffracted light beam are marked with T and ±1D respectively.

Figure 4:
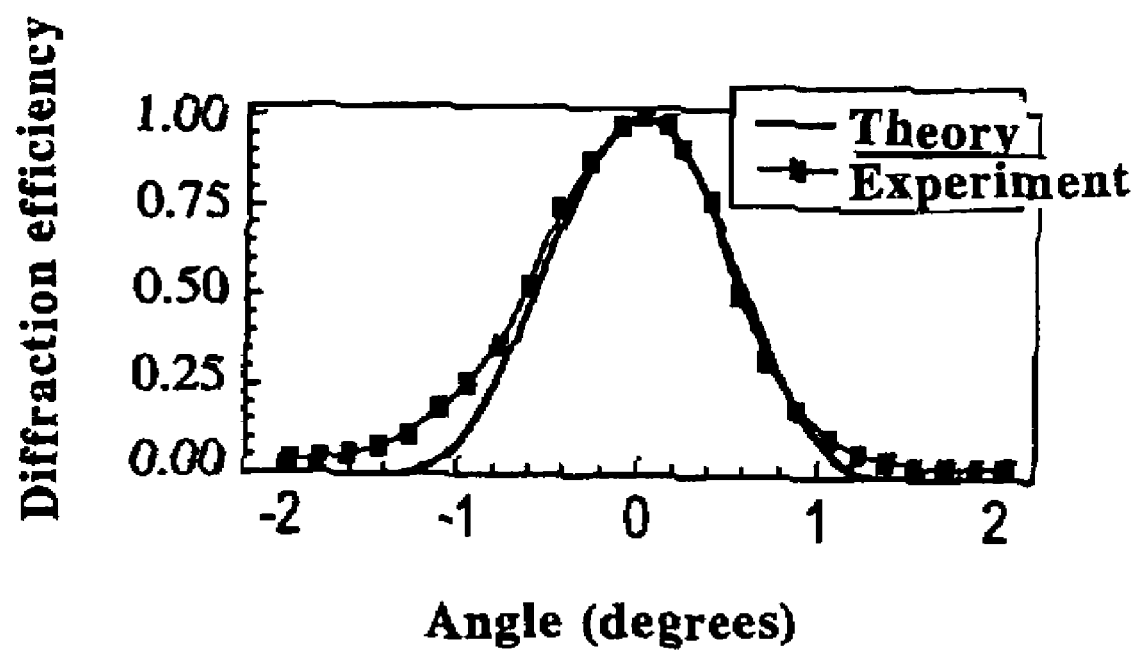
FIG. 4 is a graph showing the theoretical value and the experimental value of the diffraction efficiency of the Bragg diffraction lattice formed according to the 3D holographic recording method in the invention.

FIG. 4 is a graph showing the theoretical value and the experimental value of the diffraction efficiency of the diffraction lattice normalized to the deviation from Bragg angle, and the refractive index change at the time when the theoretical value best coincides with the experimental value was 5.7×10$^{-4}$. The diffraction lattice period, found by the measurement of the angle of the Bragg diffraction into the ±1 order and the application of Bragg condition $\lambda$=2$\Lambda$ sin(θ), was $\Lambda$=1.15 µm, and the thickness L of the diffraction lattice was found by the computation from the curve shown in FIG. 4 to be L=66 µm.

From the above results, it can be said that Bragg diffraction lattice that is a pure phase structure can be recorded in PTR glass by the application of femto-second laser pulses.

In addition, a 3D structure as above was not recorded on the pure silicate glass that was the matrix of the PTR glass after a similar femto-second laser exposure.

Figure 8:
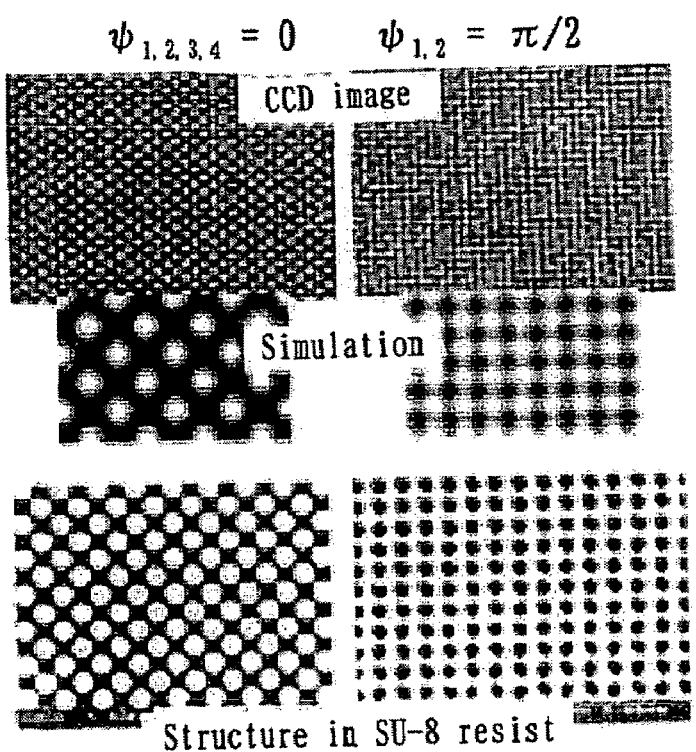
FIG. 8 is a diagram showing the CCD images, the simulated patterns, and actually formed structures in the examples.

Further, by using the optical instruments as shown in FIG. 5, the Bragg lattice was formed in the negative photo-resist SU-8 membrane (Microlithograph Chemical Corp.) for tests under the same conditions as described above. FIG. 8 shows the CCD images, the simulation patterns, and the actually formed structures obtained with the use of the phase retarder and without the same for comparison. The left side images and patterns in FIG. 8 were formed without the use of the phase retarder (the phase changes of the all beams are zero). It is understood that the periodical patterns were formed.

The right side images and patterns in FIG. 8 were formed with the use of the phase retarder. The phase control was performed under the condition that $\phi_1$ and $\phi_2$ were 90 degrees ($\pi$/2), respectively, and $\phi_3$ and $\phi_4$. were zero, as mentioned above. It is understood from FIG. 8 that further fine structures were formed by using the phase retarder.

INDUSTRIAL APPLICABILITY

As described in detail, the invention of this application provides a method of 3D holographic recording on photosensitive materials capable of multi-photon exposure including glass that undergoes a photo/thermo-induced refractive index change by using a very simple optical system and by means of femto-second laser pulses.

The invention claimed is:
1. A method of 3D holographic recording comprising:
    dividing a femto-second laser pulse into a plurality of light beams;
    focusing the divided plurality of light beams in a parallel direction;
    selecting four light beams of the plurality of light beams focused in the parallel direction;
    controlling each optical phase of the selected four light beams; and
    focusing the selected four light beams into a photosensitive material capable of multi-photon exposure so that the photosensitive material is exposed to interference among the four light beams and multi-photon absorption in the photosensitive material is induced, thus recording a 3D phase hologram on the irradiated portion in the photosensitive material, wherein the photosensitive material capable of multi-photon exposure is glass that undergoes photo/thermo-induced refractive index change, and wherein the glass that undergoes photo/thermo-induced refractive index change is glass having a composition close to $15Na_2O\text{-}5ZnO\text{-}4Al_2O_3\text{-}70SiO_2\text{-}5NaF\text{-}0.01Ag_2O\text{-}0.01CeO_2$.

2. A 3D holographic recording system for performing the holographic recording method as claimed in claim 1, the system comprising:
- a laser light source for generating the femto-second laser pulse;
- a diffraction beam splitter for performing said dividing of the femto-second laser pulse into the plurality of light beams;
- a first lens for performing said focusing of the divided plurality of light beams in the parallel direction;
- an aperture for performing said selecting of the four light beams of the plurality of light beams focused in the parallel direction;
- a phase retarder for performing said controlling of each optical phase of the selected four light beams; and
- a second lens for performing said focusing of the selected four light beams into the photosensitive material.

3. The 3D holographic recording system as claimed in claim 2, wherein the first lens is an achromatic lens the second lens is an objective lens of a microscope.

4. A method of 3D holographic recording comprising:
- dividing a femto-second laser pulse into a plurality of light beams;
- focusing the divided plurality of light beams in a parallel direction;
- selecting four light beams of the plurality of light beams focused in the parallel direction;
- controlling each optical phase of the selected four light beams; and
- focusing the selected four light beams into a photosensitive material capable of multi-photon exposure so that the photosensitive material is exposed to interference among the four light beams and multi-photon absorption in the photosensitive material is induced, thus recording a 3D phase hologram on the irradiated portion in the photosensitive material, wherein the phase hologram recorded on the irradiated portion in the photosensitive material is a Bragg diffraction lattice, wherein the photosensitive material capable of multi-photon exposure is glass that undergoes photo/thermo-induced refractive index change, and wherein the glass that undergoes photo/thermo-induced refractive index change is glass having a composition close to $15Na_2O\text{-}5ZnO\text{-}4Al_2O_3\text{-}70SiO_2\text{-}5NaF\text{-}0.01Ag_2O\text{-}0.01CeO_2$.

5. A 3D holographic recording system for performing the holographic recording method as claimed in claim 4, the system comprising:
- a laser light source for generating the femto-second laser pulse;
- a diffraction beam splitter for performing said dividing of the femto-second laser pulse into the plurality of light beams;
- a first lens for performing said focusing of the divided plurality of light beams in the parallel direction;
- an aperture for performing said selecting of the four light beams of the plurality of light beams focused in the parallel direction;
- a phase retarder for performing said controlling of each optical phase of the selected four light beams; and
- a second lens for performing said focusing of the selected four light beams into the photosensitive material.

6. The 3D holographic recording system as claimed in claim 5, wherein the first lens is an achromatic lens, and the second lens is an objective lens of a microscope.

7. A method of 3D holographic recording comprising:
- dividing a femto-second laser pulse into a plurality of light beams;
- focusing the divided plurality of light beams in a parallel direction;
- selecting four light beams of the plurality of light beams focused in the parallel direction;
- controlling each optical phase of the selected four light beams; and
- focusing the selected four light beams into a photosensitive material capable of multi-photon exposure so that the photosensitive material is exposed to interference among the four light beams and multi-photon absorption in the photosensitive material is induced, thus recording a 3D phase hologram on the irradiated portion in the photosensitive material, wherein the phase hologram recorded on the irradiated portion in the photosensitive material is a Bragg diffraction lattice, wherein the Bragg diffraction lattice is used as a photonic crystal, wherein the photosensitive material capable of multi-photon exposure is glass that undergoes photo/thermo-induced refractive index change, and wherein the glass that undergoes photo/thermo-induced refractive index change is glass having a composition close to $15Na_2O\text{-}5ZnO\text{-}4Al_2O_3\text{-}70SiO_2\text{-}5NaF\text{-}0.01Ag_2O\text{-}0.01CeO_2$.

8. A 3D holographic recording system for performing the holographic recording method as claimed in claim 7, the system comprising:
- a laser light source for generating the femto-second laser pulse;
- a diffraction beam splitter for performing said dividing of the femto-second laser pulse into the plurality of light beams;
- a first lens for performing said focusing of the divided plurality of light beams in the parallel direction;
- an aperture for performing said selecting of the four light beams of the plurality of light beams focused in the parallel direction;
- a phase retarder for performing said controlling of each optical phase of the selected four light beams; and
- a second lens for performing said focusing of the selected four light beams into the photosensitive material.

9. The 3D holographic recording system as claimed in claim 8, wherein the first lens is an achromatic lens, and the second lens is an objective lens of a microscope.

* * * * *